United States Patent

Kawasaki et al.

Patent Number: 5,598,106
Date of Patent: Jan. 28, 1997

[54] SEMICONDUCTOR INTEGRATED CIRCUIT FOR PREVENTING DETERIORATION OF THE CHARACTERISTICS OF AN N-CHANNEL TYPE TRANSISTOR

[75] Inventors: Yuji Kawasaki; Jun Koyama, both of Kanagawa, Japan

[73] Assignee: Semiconductor Energy Laboratory Co., Ltd., Kanagawa-ken, Japan

[21] Appl. No.: 445,412

[22] Filed: May 19, 1995

[30] Foreign Application Priority Data

May 20, 1994 [JP] Japan ................................ 6-131417

[51] Int. Cl.⁶ ............................................. H03K 17/10
[52] U.S. Cl. .............................. 326/21; 326/9; 326/81; 326/121
[58] Field of Search ........................... 326/9, 21, 31, 326/81, 112, 121

[56] References Cited

U.S. PATENT DOCUMENTS

4,704,547  11/1987  Kirsch .............................. 326/9
4,857,763  8/1989   Sakurai et al. ..................... 326/9
5,457,420  10/1995  Asada ............................. 326/81 X Primary Examiner—David R. Hudspeth
Attorney, Agent, or Firm—Sixbey, Friedman, Leedom & Ferguson; Gerald J. Ferguson, Jr.; Bradley D. Blanche

[57] ABSTRACT

In a semiconductor integrated circuit constructed by thin film transistors (TFTs), an invertor circuit or a NAND circuit is formed by arranging a transmission gate circuit, a P-channel type TFT or an N-channel type TFT between a circuit including at least one P-channel type TFT and a circuit including at least one N-channel type TFT. The N-channel type TFT is earthed. Voltage drop produces by the arranged transmission gate circuit or P-channel or N-channel type TFT, so that the drain voltage of the earthed N-channel type TFT is decreased and an electric field near the drain region of the N-channel type TFT is decreased.

12 Claims, 7 Drawing Sheets

SEMICONDUCTOR INTEGRATED CIRCUIT FOR PREVENTING DETERIORATION OF THE CHARACTERISTICS OF AN N-CHANNEL TYPE TRANSISTOR

BACKGROUND OF THE INVENTION

The present invention relates to a high reliability thin film semiconductor integrated circuit for preventing deterioration of an N-channel type thin film transistor (TFT).

Figure 4:
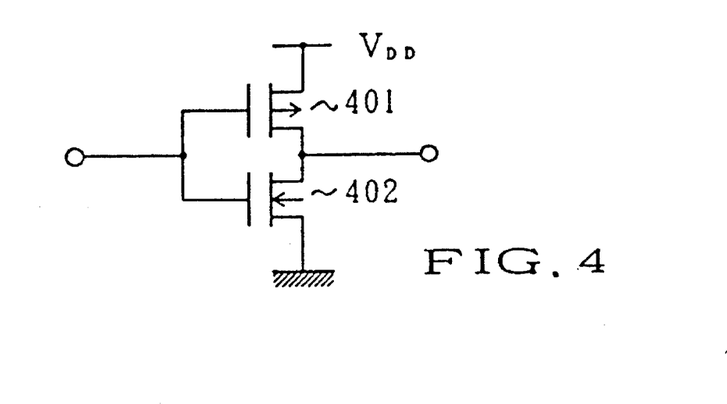
FIG. 4 shows an invertor circuit in a conventional thin film semiconductor integrated circuit.
Figure 5:
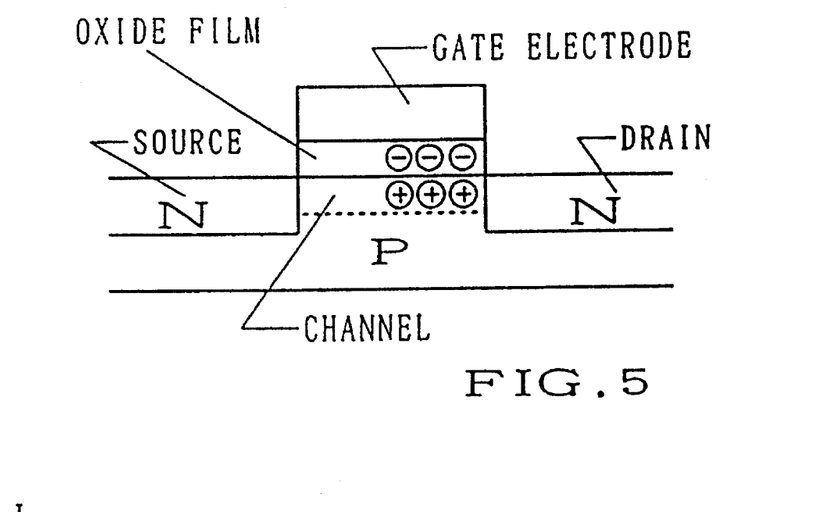
FIG. 5 shows deterioration of the channel of an N-channel type TFT in a conventional thin film semiconductor integrated circuit.
Figure 6:
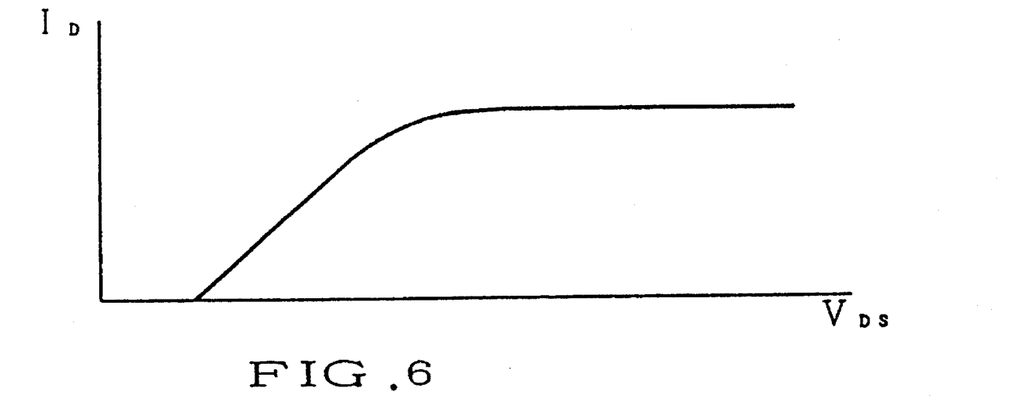
FIG. 6 shows $V_{DS}$-$I_D$ characteristic in a case wherein the channel of an N-channel type TFT is deteriorated in a conventional thin film semiconductor integrated circuit.

As shown in FIG. 4, an invertor circuit is constructed by connecting the drain electrode of a P-channel type thin film transistor (TIT) 401 with the drain electrode of an N-channel type TFT 402. In this state, a large current flows into the drain electrode of the N-channel type TFT 402. As shown in Jig.5, if the drain voltage in the N-channel type TFT 402 is high, an electron within the gate electrode of the N-channel type TIT 402 is trapped in an oxide film as an insulating film near a drain region, so that a weak P-type region is formed in a interface portion between the drain region and a channel forming region. This prevents a drain current in the N-channel type TFT 402. Therefore, it is required that $V_{DS}$ is increased in comparison with a normal case, as shown in FIG. 6 and the thickness of a channel forming region of the N-channel type TFT 402 is increased, to reduce influence by the weak P-type region. As a result, characteristics of an N-channel type TIT change and deteriorate easily in comparison with a P-channel type so that deterioration of the characteristics reduces the reliability of a thin film semiconductor integrated circuit. This is the same in another basic circuit, for example, a NAND circuit. That is, as similar to an invertor circuit, an earthed N-channel type TFT is deteriorated easily.

As described above, when a drain voltage is high, a strong electric field (having a high strength) is generated near a drain region and therefore a weak P-type region is formed within a channel forming region, so that a drain current is prevented. Accordingly, characteristics of an N-channel type TFT deteriorate easily in comparison with that of a P-channel type TFT.

SUMMARY OF THE INVENTION

The object of the present invention is to solve the above problem.

Figure 1A:
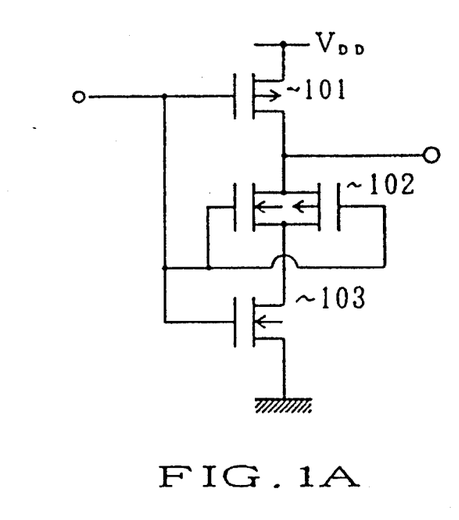
FIGS. 1A to 1D and FIGS. 2A to 2D show an invertor circuit including a transmission gate circuit constructed by thin film transistors (TFTs) in a thin film semiconductor integrated circuit according to an embodiment of the present invention.

As shown in FIG.1A, in an invertor circuit constructed by thin film transistors (TFTs), a transmission gate circuit 102 is arranged between a P-channel type TFT 101 and an N-channel type TFT 103, so that voltage drop produces by the transmission gate circuit 102 and an electric field near the drain region of the N-channel type TFT 103 decreases, to prevent deterioration of the characteristics.

Figure 3A:
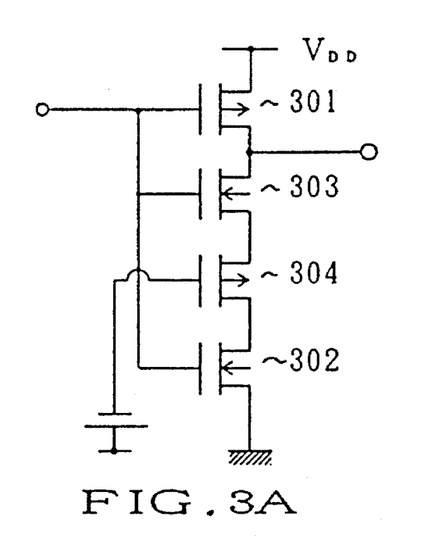
FIGS. 3A to 3C show an invertor circuit constructed using an N-channel type TFT or a P-channel type TFT in a thin film semiconductor integrated circuit according to another embodiment.

Also, as shown in FIG. 3A, in an invertor circuit constructed by TFTs, an N-channel type TFT 303 and a P-channel type TFT 304 are arranged between a P-channel type TFT 301 and an N-channel type TFT 302, so that voltage drop produces by the N-channel type TFT 303 and the P-channel type TFT 304 and an electric field near the drain region of the N-channel type TFT 302 decreases, to prevent deterioration of the characteristics.

Figure 3B:
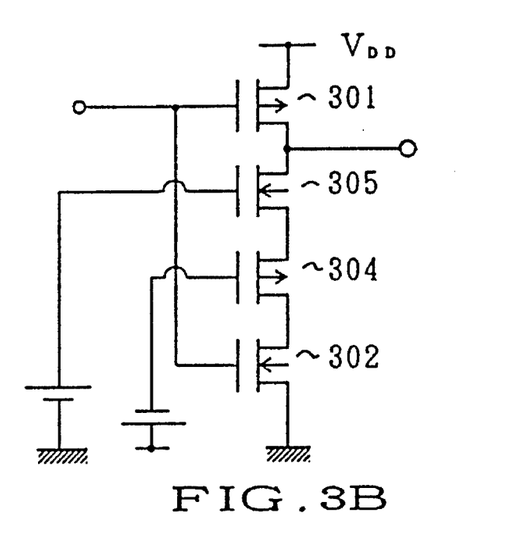
Figure 3C:
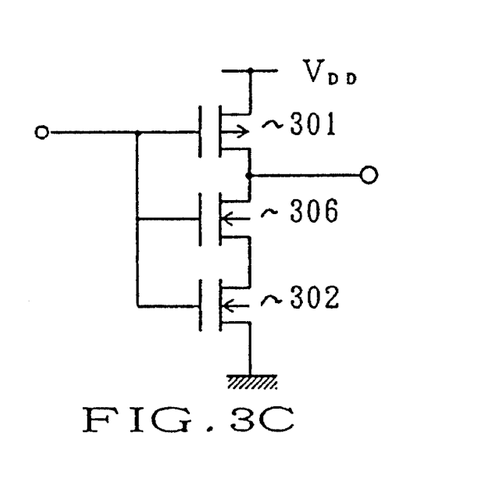

Further, as shown in FIG. 3C, in an invertor circuit constructed by TFTs, an N-channel type TFT 306 is arranged between the P-channel type TFT 301 and the N-channel type TFT 302, so that voltage drop produces by the N-channel type TFT 306 and an electric field near the drain region of the N-channel type TFT 302 decreases, to prevent deterioration of the characteristics.

Figure 2A:
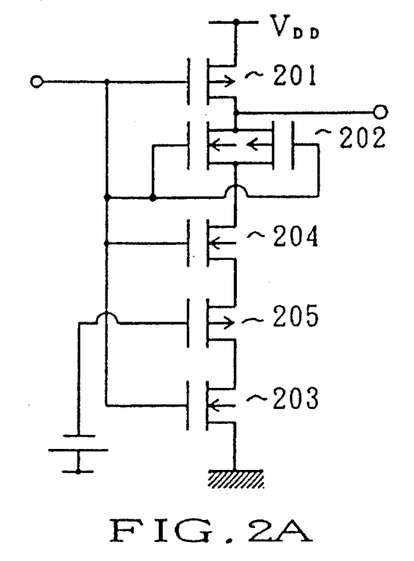

Furthermore, as shown in FIG. 2A, when the source electrode of an N-channel type TFT 203 is earthed (grounded) in a. NAND circuit constructed by TFTs, voltage drop produces by connecting the drain electrode of the N-channel type TFT 203 with an N-channel type TFT 204 and a P-channel type TFT 205 and an electric field near the drain region of the earthed N-channel type TFT 203 decreases, to prevent deterioration of the characteristics.

DETAILED DESCRIPTION OF THE PREFERRED EMBODIMENTS

[Embodiment 1]

In an invertor circuit of FIG. 1A, a transmission gate circuit 102 is connected with an input terminal and arranged between a P-channel type thin film transistor (TFT) 101 and an N-channel type TFT 103. The transmission gate circuit 102 is a switch circuit to be turned on regardless of a level of the input signal. Also, since voltage drop produces, an electric field near a drain region of the N-channel type TFT 103 is decreased. As a result, deterioration of characteristics of the N-channel type TFT 103 can be prevented. A plurality of transmission gate circuits may be arranged.

Figure 10:
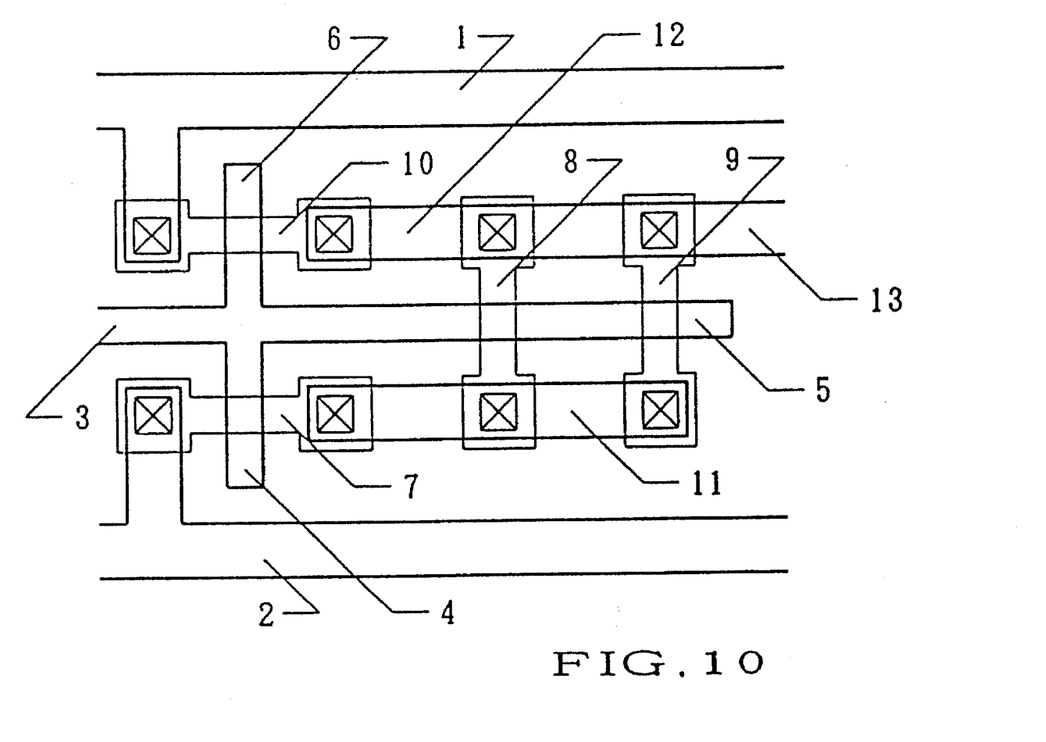
FIG. 10 shows a layout of an invertor circuit including a transmission gate circuit constructed by TFTs in a thin film semiconductor integrated circuit according to another embodiment.

In a layout of the embodiment of FIG. 10, arrangements (wirings) connected with gate electrodes have a cross shape. Transistors are arranged across the cross shaped gate electrode and arrangements.

An arrangement 1 is a drain arrangement for supplying a drain voltage, and an arrangement 2 is an earth arrangement for providing an earth voltage. The gate electrode and arrangements have four parts, that is, an input arrangement 3, a first gate electrode and arrangement 4, a second gate electrode and arrangement 5 and a third gate electrode and arrangement. The gate electrode and-arrangements 4 and 6 are formed in the same first straight line, and the input arrangement 3 and the gate electrode and arrangement 5 are formed in the same second straight line. The first straight line is approximately perpendicular to the second straight line. N-type semiconductor regions 7 are formed across the first gate electrode and arrangement 4, to form the N-channel type TFT 103. Simultaneously, P-type semiconductor regions 10 are formed across the third gate electrode and arrangement 6, to form the P-channel type TFT 101. N-type semiconductor regions 8 and P-type semiconductor regions 9 are formed across the second gate electrode and arrangement 5, to form N-channel type and P-channel type TFTs, that is, the transmission gate circuit 102. One of the N-type semiconductor regions 7 is connected with the earth arrangement 2, and one of the P-type semiconductor regions 10 is connected with the drain arrangement 1. Arrangements 11 and 12 are formed in approximately parallel to the second gate electrode and arrangement 5. The arrangement 11 connects the N-type semiconductor regions 7 and 8 with the P-type semiconductor regions 9. The arrangement 12 connects the P-type semiconductor regions 9 and 10 with the N-type semiconductor regions 8. An output arrangement 13 is extended from the arrangement 13.

In FIG. 10, the P-type semiconductor regions 9 are formed. FIG. 3C shows a case wherein the P-type semiconductor regions 9 are not formed. FIGS. 3A and 3B is a modification of FIG. 3C. A basic structure is a structure without arranging the P-type semiconductor regions 9 in FIG. 10.

[Embodiment 2]

Figure 1B:
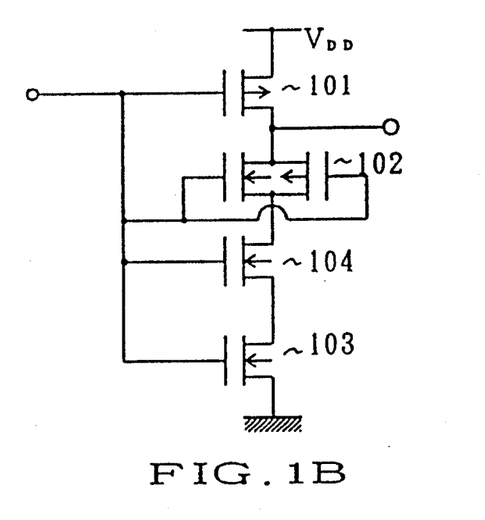

In an invertor circuit constructed by TFTs, as shown in FIG. 1B, an N-channel type TFT 104 is arranged between the transmission gate circuit 102 and the N-channel type TFT 103, and an input signal of the invertor circuit is supplied to the N-channel type TFT 104. Since voltage drop in the circuit of FIG. 1B is larger than that in the circuit of FIG. 1A, an electric field near the drain region of the N-channel type TFT 103 in which the source electrode is earthed is further decreased, so that deterioration of the characteristics can be prevented. A plurality of N-channel type TFTs may be arranged.

In the embodiment, since the N-channel type TFT 104 is added to the circuit of FIG. 1A, the embodiment is based on a structure of FIG. 10.

[Embodiment 3]

Figure 1C:
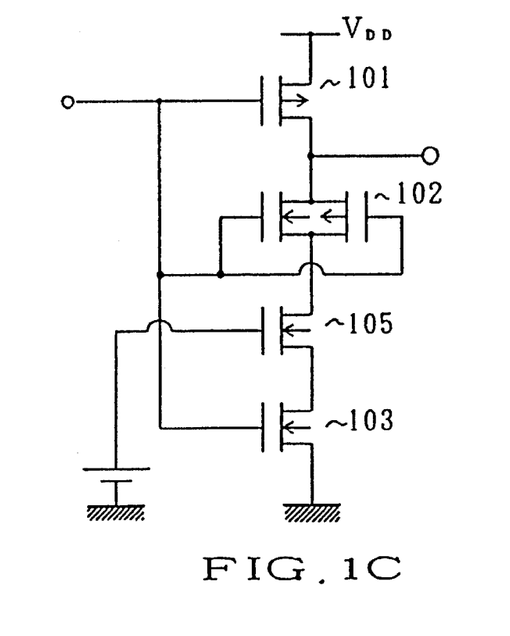

In an invertor circuit constructed by TFTs, as shown in FIG. 1C, an N-channel type TFT 105 which is in an ON state is arranged between the transmission gate circuit 102 of FIG. 1A and the N-channel type TFT 103. Since voltage drop by the circuit of FIG. 1C is larger than that by the circuit of FIG. 1A, an electric field near the drain region of the N-channel type TFT 103 in which the source electrode is earthed is further decreased, so that deterioration of the characteristics can be prevented. A plurality of N-channel type TFTs may be arranged. In the embodiment, since the N-channel type TFT 105 is added to the circuit of FIG. 1A, the embodiment is based on a structure of FIG. 10.

[Embodiment 4]

Figure 1D:
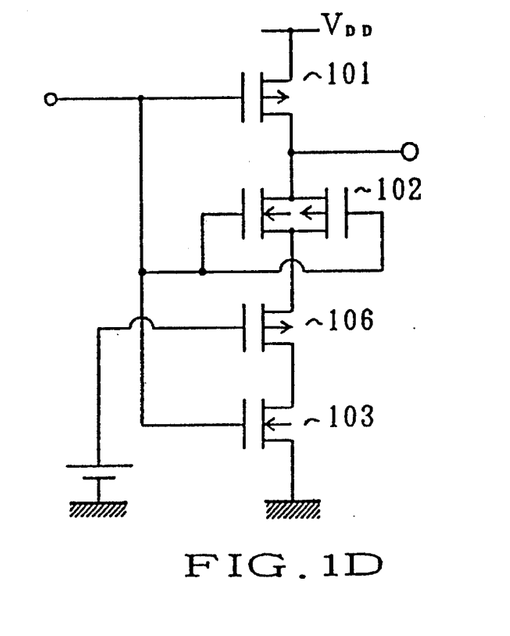

In an invertor circuit constructed by TFTs, as shown in FIG. 1D, a P-channel type TFT 106 which is in an ON state is arranged between the transmission gate circuit 102 of FIG. 1A and the N-channel type TFT 103. Since voltage drop by the circuit of FIG. 1D is larger than that by the circuit of FIG. 1A, an electric field near the drain region of the N-channel type TFT 103 in which the source electrode is earthed is further decreased, so that deterioration of the characteristics can be prevented. A plurality of P-channel type TFTs may be arranged.

In the embodiment, since the P-channel type TFT 106 is added to the circuit of FIG. 1A, the embodiment is based on a structure of FIG. 10.

[Embodiment 5]

In an invertor circuit constructed by TFTs, as shown in FIG. 2A, a P-channel type TFT 205 which is in an ON state is arranged between the N-channel type TFTs 103 and 104 (203 and 204) in the invertor circuit of FIG. 1B. Since voltage drop produces by the arranged P-channel type TFT, deterioration of the characteristics of the N-channel type TFT 203 in which the source electrode is earthed can be prevented. A plurality of P-channel type TFTs may be arranged.

In the embodiment, since the N-channel type TFT 204 and the P-channel type TFT 205 are added to the circuit of FIG. 1A, the embodiment is based on a structure of FIG. 10.

[Embodiment 6]

Figure 2B:
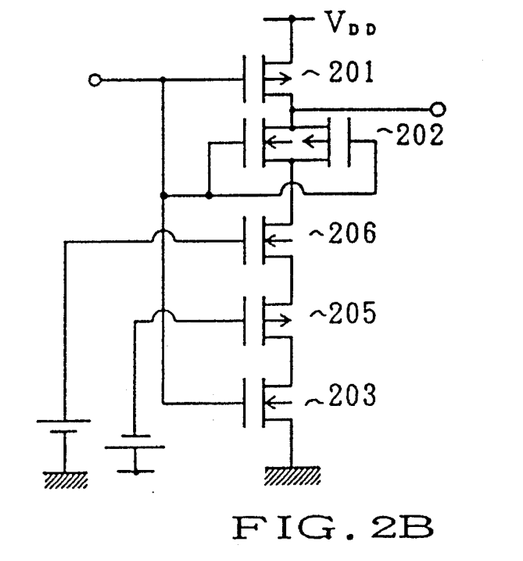

In an invertor circuit constructed by TFTs, as shown in FIG. 2B, the P-channel type TFT 205 which is in an ON state is arranged between the N-channel type TFTs 103 and 105 (203 and 206) in the invertor circuit of FIG. 1C. Since voltage drop produces by the arranged P-channel type TFT, deterioration of the characteristics of the N-channel type TFT 203 in which the source electrode is earthed can be prevented. A plurality of P-channel type TFTs may be arranged.

In the embodiment, since the N-channel type TFT 206 and the P-channel type TFT 205 are added to the circuit of FIG. 1A, the embodiment is based on a structure of FIG. 10.

[Embodiment 7]

Figure 2C:
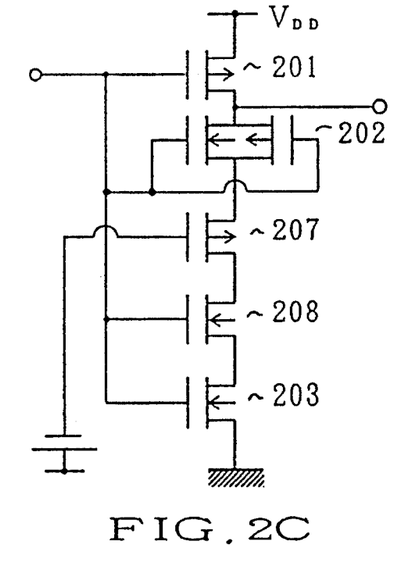

In an invertor circuit constructed by TFTs, as shown in FIG. 2C, an N-channel type TFT 208 which an input signal of the invertor circuit is supplied to is arranged between the P-channel type TFT 106 (207) and the N,channel type TFT 103 (203) in the invertor circuit of FIG. 1D. Since voltage drop produces by the arranged N-channel type TFT, deterioration of the characteristics of the N-channel type TFT 203 in which the source electrode is earthed can be prevented. A plurality of N-channel type TFTs may be arranged.

In the embodiment, since the N-channel type TFT 208 and the P-channel type TFT 207 are added to the circuit of FIG. 1A, the embodiment is based on a structure of FIG. 10.

[Embodiment 8]

Figure 2D:
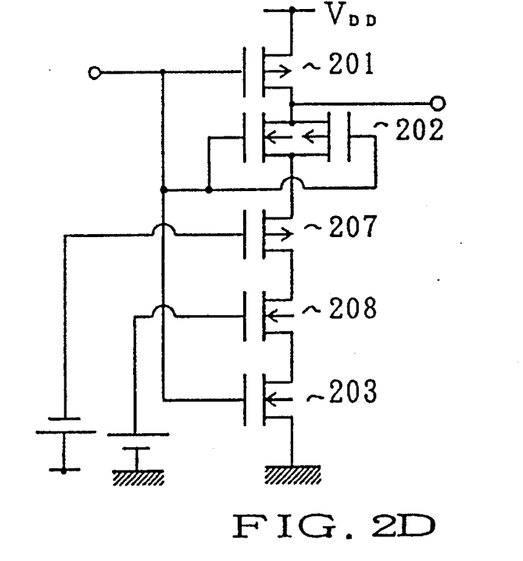

In an invertor circuit constructed by TFTs as shown in FIG. 2D, the N-channel type TFT 208 which is in an ON state is arranged between the P-channel type TFT 106 (207) and the N-channel type TFT 103 (203) in the invertor circuit of FIG. 1D. Since voltage drop produces by the arranged N-channel type TFT, deterioration of the characteristics of the N-channel type TFT 203 in which the source electrode is earthed can be prevented. A plurality of N-channel type TFTs may be arranged.

In the embodiment, since the N-channel type TFT 208 and the P-channel type TFT 207 are added to the circuit of FIG. 1A, the embodiment is based on a structure of FIG. 10.

[Embodiment 9]

In an invertor circuit constructed by TFTs as shown in FIG. 3A, an N-channel type TFT 303 and a P-channel type TFT 304 are arranged between a P-channel type TFT 301 and an N-channel type TFT 302. An input signal to the invertor circuit is supplied the N-channel type TFT 303, and the P-channel type TFT 304 is in an ON state. Therefore, since voltage drop produces by the arranged TFTs, deterioration of the characteristics of the N-channel type TFT 302 in which the source electrode is earthed can be prevented. A plurality of N-channel type TFTs and a plurality of P-channel type TFTs may be arranged.

[Embodiment 10]

In an invertor circuit constructed by TFTs as shown in FIG. 3B, an N-channel type TFT 305 and the P-channel type TFT 304 are arranged between the P-channel type TFT 301 and the N-channel type TFT 302. The N-channel type TFT 305 and the P-channel type TFT 304 each are in an ON state. Therefore, since voltage drop produces by the arranged TFTs, deterioration of the characteristics of the N-channel type TFT 302 in which the source electrode is earthed can be prevented. A plurality of N-channel type TFTs and a plurality of P-channel type TFTs may be arranged.

[Embodiment 11]

In an invertor circuit constructed by TFTs as shown in FIG. 3C, an N-channel type TFT 306 is arranged between the P-channel type TFT 301 and the N-channel type TFT 302. An input signal to the invertor circuit is applied to the N-channel type TFT 306. Therefore, since voltage drop produces by the arranged TFT, deterioration of the characteristics of the N-channel type TFT 302 in which the source electrode is earthed can be prevented. A plurality of N-channel type TFTs may be arranged.

[Embodiment 12]

Figure 7A:
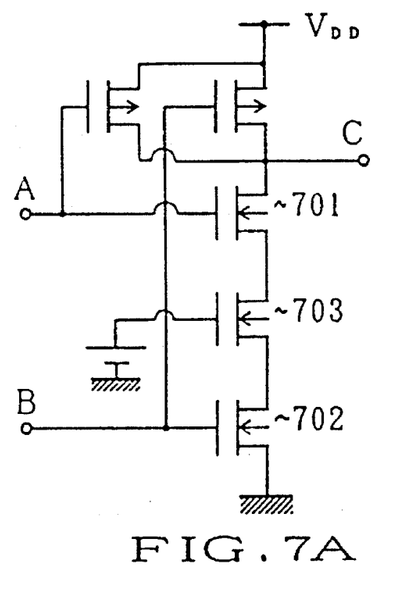
FIGS. 7A to 7D and FIGS. 8A to 8D show a NAND circuit constructed using an N-channel type TFT or a P-channel type TFT in a thin film semiconductor integrated circuit according to another embodiment.

In a NAND circuit constructed by TFTs, as shown in FIG. 7A, an N-channel type TFT 703 which is in an ON state is arranged between N-channel type TFTs 701 and 702. In this state, since voltage drop produces by the arranged N-channel type TFT 703, deterioration of the characteristics of the N-channel type TFT 702 in which the source electrode is earthed can be prevented. A plurality of N-channel type TFTs may be arranged.

[Embodiment 13]

Figure 7B:
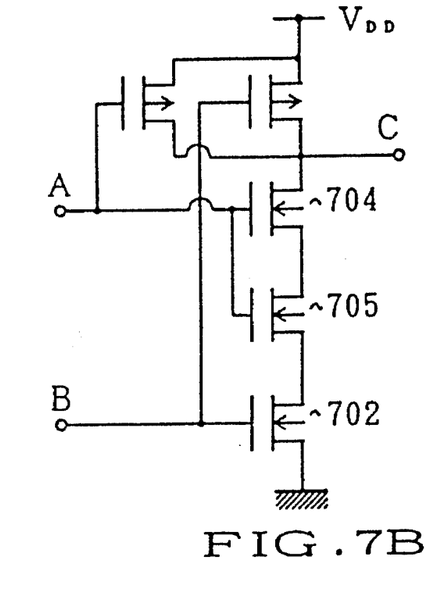

In a NAND circuit constructed by TFTs, as shown in FIG. 7B, an N-channel type TFT 705 is arranged between the N-channel type TFTs 702 and 704, and the arranged N-channel type TFT 705 is connected with an input terminal A, that is, the N-channel type TFT 705. In this state, since voltage drop produces by the arranged N-channel type TFT 705, deterioration of the characteristics of the N-channel type TFT 702 in which the source electrode is earthed can be prevented. A plurality of N-channel type TFTs may be arranged.

[Embodiment 14]

Figure 7C:
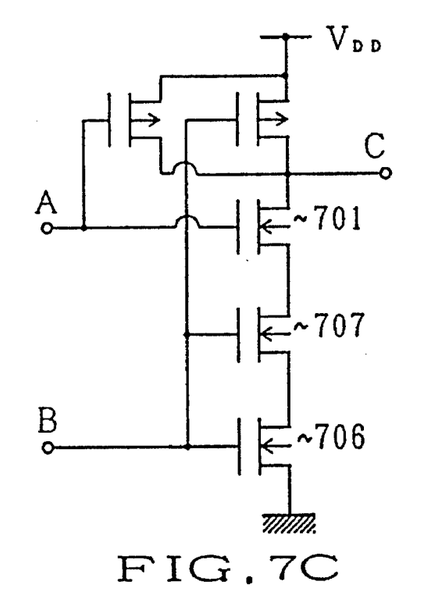

In a NAND circuit constructed by TFTs, as shown in FIG. 7C, an N-channel type TFT 707 is arranged between the N-channel type TFTs 701 and 706, and the arranged N-channel type TFT 707 is connected with an input terminal B, that is, the N-channel type TFT 706. In this state, since voltage drop produces by the arranged N-channel type TFT 707, deterioration of the characteristics of the N-channel type TFT 706 in which the source electrode is earthed can be prevented. A plurality of N-channel type TFTs may be arranged.

[Embodiment 15]

Figure 7D:
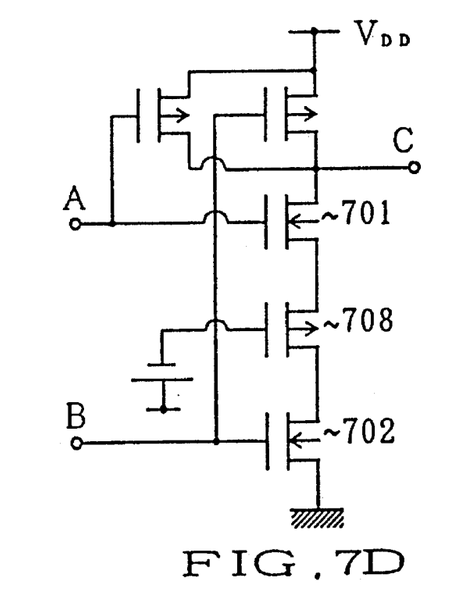

In a NAND circuit constructed by TFTs, as shown in FIG. 7D, a P-channel type TFT 708 which is in an ON state is arranged between the N-channel type TFTs 701 and 702. In this state, since voltage drop produces by the arranged P-channel type TFT 708, deterioration of the characteristics of the N-channel type TFT 702 in which the source electrode is earthed can be prevented. A plurality of P-channel type TFTs may be arranged.

[Embodiment 16]

Figure 8A:
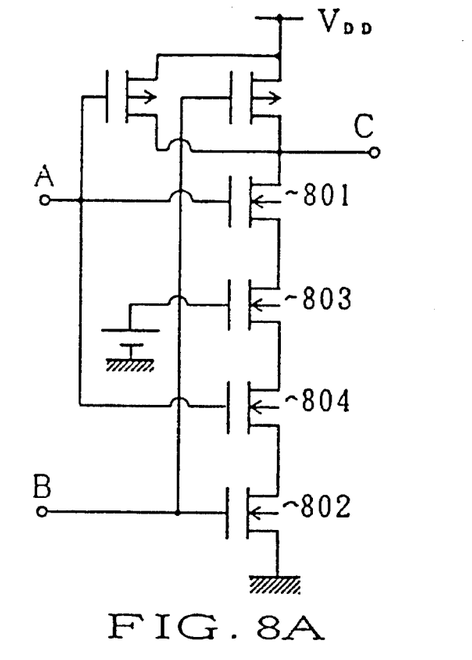

In a NAND circuit constructed by TFTs, as shown in FIG. 8A, an N-channel type TFT 803 which is in an ON state is arranged between the N-channel type TFTs 704 (801) and 705 (804), in the NAND circuit of FIG. 7B. In this state, since voltage drop produces by the N-channel type TFTs 803 and 804, deterioration of the characteristics of an N-channel type TFT 802 in which the source electrode is earthed can be prevented. A plurality of N-channel type TFTs may be arranged.

[Embodiment 17]

Figure 8B:
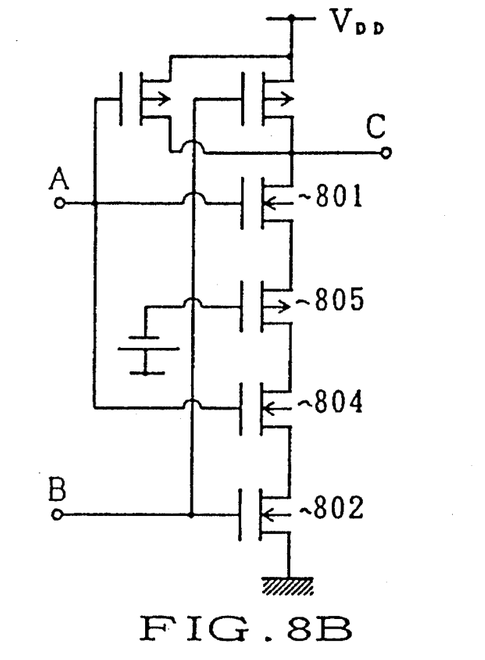

In a NAND circuit constructed by TFTs, as shown in FIG. 8B, a P-channel type TFT 805 which is in an ON state is arranged between the N-channel type TFTs 704 (801) and 705 (804) in the NAND circuit of FIG. 7B. In this state, since voltage drop produces by the N-channel type TFT 804 and the P-channel type TFT 805, deterioration of the characteristics of the N-channel type TFT 802 in which the source electrode is earthed can be prevented. A plurality of P-channel type TFTs may be arranged.

[Embodiment 18]

Figure 8C:
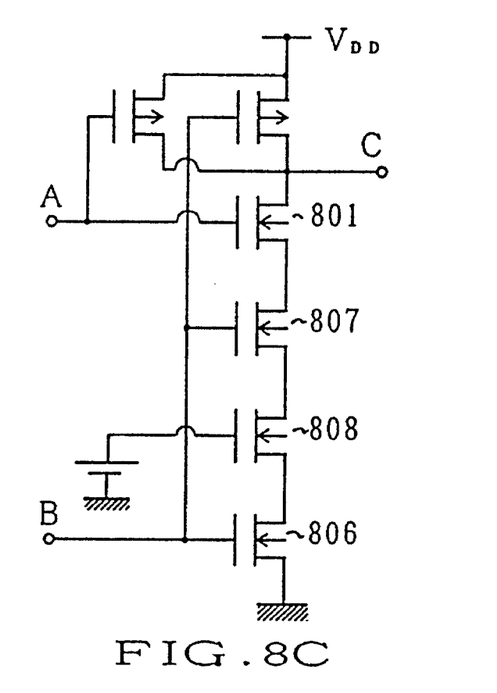

In a NAND circuit constructed by TFTs, as shown in FIG. 8C, an N-channel type TFT 808 which is in an ON state is arranged between the N-channel type TFTs 706 (806) and 707 (807) in the NAND circuit of FIG. 7C. In this state, since voltage drop produces by the N-channel type TFTs 807 and 808, deterioration of the characteristics of the N-channel type TFT 806 in which the source electrode is earthed can be prevented. A plurality of N-channel type TFTs may be arranged.

[Embodiment 19]

Figure 8D:
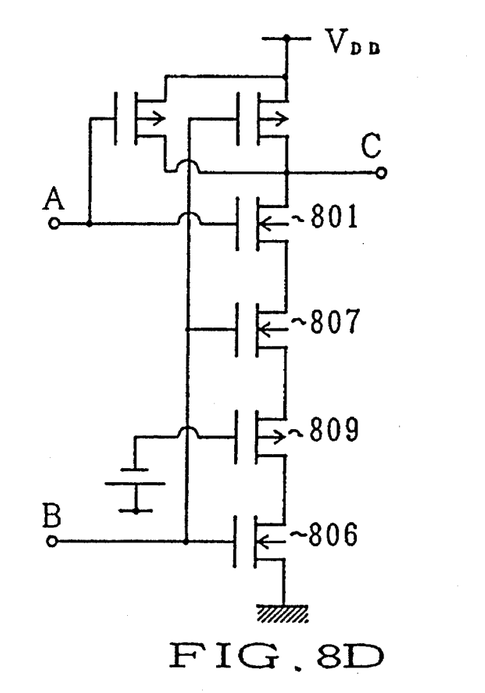

In a NAND circuit constructed by TFTs, as shown in FIG. 8D, a P-channel type TFT 809 which is in an ON state is arranged between the N-channel type TFTs 706 (806) and 707 (807) in the NAND circuit of FIG. 7C. In this state, since voltage drop produces by the N-channel type TFT 807 and the P-channel type TFT 809, deterioration of the characteristics of the N-channel type TFT 806 in which the source electrode is earthed can be prevented. A plurality of P-channel type TFTs may be arranged.

[Embodiment 20]

Figure 9:
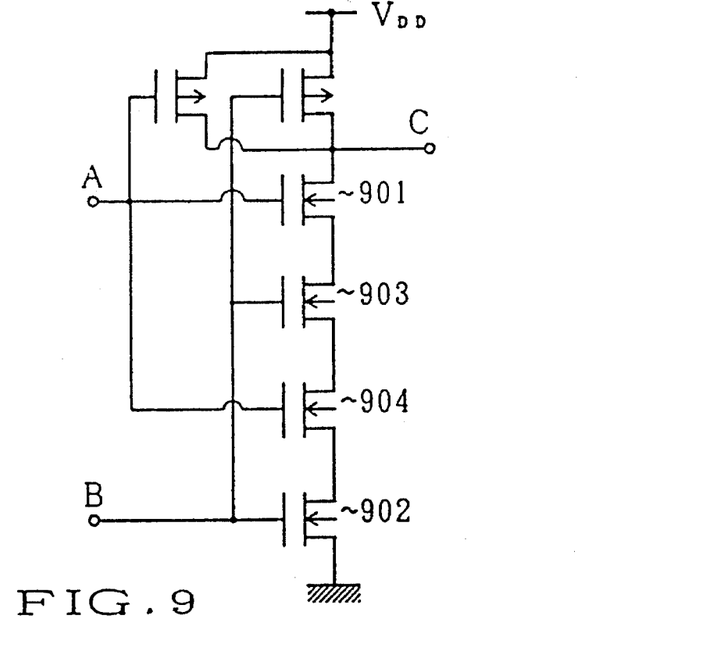
FIG. 9 shows a NAND circuit constructed using an N-channel type TFT in a thin film semiconductor integrated circuit according to another embodiment.

In a NAND circuit constructed by TFTs, as shown in FIG. 9, N-channel type TFTs 903 and 904 are arranged between the N-channel type TFTs 901 and 902. In this state, an input terminal A is connected with the N-channel type TFTs 901 and 904, and an input terminal B is connected with the N-channel type TFTs 90.2 and 903. Since voltage drop produces by the N-channel type TFTs 903 and 904, deterioration of the characteristics of the N-channel type TFT 902 in which the source electrode is earthed can be prevented. A plurality of N-channel type TFTs may be arranged.

As described above, in the present invention, since the drain electrode of the N-channel type TFT which the source electrode is earthed is connected with the N-channel type or P-channel type TFT, so that voltage drop produces and an electric field near the drain region of the N-channel type TFT in which the source electrode is earthed can be decreased. Also, deterioration of characteristics of the N-channel type TFT can be prevented. Further, the reliability of a thin film semiconductor integrated circuit can be improved.

What is claimed is:

1. A semiconductor integrated circuit comprising:

a first transistor circuit which includes at least one P-channel type transistor and has a first signal input terminal and a first signal output terminal;

a second transistor circuit which includes at least one N-channel type transistor and has a second signal input terminal connected with the first signal input terminal and a second signal output terminal; and at least one transmission gate circuit which is arranged between the first and second output terminals and electrically connected to the first and second output terminal, wherein the transmission gate circuit has two input terminals and an input signal supplied to the first and second transistor circuits is input to the two input terminals of the transmission gate circuit.

2. The circuit of claim 1 wherein the second transistor circuit further comprises at least one additional N-channel type transistor which is in an ON state.

3. The circuit of claim 1 wherein the second transistor circuit further comprises at least one N-channel type transistor which an input signal is input to.

4. The circuit of claim 1 wherein the second transistor circuit further comprises at least one P-channel type transistor which is in an ON state.

5. The circuit of claim 1 wherein the second transistor circuit further comprises at least one N-channel type transistor which is in an ON state and at least one P-channel type transistor which is in an ON state.

6. The circuit of claim 1 wherein the second transistor circuit further comprises at least one N-channel type transistor which an input signal is input to and at least one P-channel type transistor which is in an ON state.

7. The circuit of claim 1 wherein the second transistor circuit further comprises at least one N-channel type transistor which is in an ON state and at least one P-channel type transistor which an input signal is input to.

8. A semiconductor integrated circuit comprising:

a first transistor circuit which includes at least one P-channel type transistor and has a first signal input terminal and a first signal output terminal;

a second transistor circuit which includes at least one N-channel type transistor and at least one P-channel type transistor connected with the N-channel type transistor and has a second signal input terminal and a second signal output terminal, wherein the P-channel type transistor is in an ON state; and at least one N-channel type transistor arranged between the first and second signal output terminals, wherein source and drain terminals of the P-channel type transistor of the second transistor circuit are connected with the arranged N-channel type transistor and the N-channel type transistor of the second transistor circuit.

9. The circuit of claim 8 wherein the arranged N-channel type TFT is in an ON state.

10. A semiconductor integrated circuit comprising:

a first transistor circuit which includes at least one P-channel type transistor and has a first signal input terminal and a first signal output terminal;

a second transistor circuit which includes at least one N-channel type transistor and at least one P-channel type transistor connected with the N-channel type transistor and has a second signal input terminal and a second signal output terminal, wherein the P-channel type transistor is in an ON state; and at least one N-channel type transistor arranged between the first and second signal output terminals, wherein an input signal supplied to the first and second transistor circuits is input to the arranged N-channel type transistor, and wherein source and drain terminals of the P-channel type transistor of the second transistor circuit are connected with the arranged N-channel type transistor and the N-channel type transistor of the second transistor circuit.

11. A semiconductor integrated circuit comprising:

a first transistor circuit which includes at least one P-channel type transistor and has a first signal input terminal and a first signal output terminal; and a second transistor circuit which includes at least two N-channel type transistors and has a second signal input terminal and a second signal output terminal, wherein the first and second signal input terminals are connected with each other and the first and second signal output terminals are connected with each other, wherein the N-channel type transistor is larger than the P-channel type transistor in number.

12. A semiconductor integrated circuit comprising:

a signal input wiring;

a first gate electrode wiring;

a second gate electrode wiring, wherein the first and second gate electrode wirings are formed on the same line, the first and third gate electrode wirings are approximately perpendicular to the second gate electrode wiring, and the second gate electrode wiring and the input wiring are formed on the same line;

a first N-type semiconductor region formed across the first gate electrode wiring;

a second N-type semiconductor region formed across the second gate electrode wiring;

a P-type semiconductor region formed across the third gate electrode wiring;

a first wiring connecting the first N-type semiconductor region with the second N-type semiconductor region; and a second wiring connecting the P-type semiconductor region with the second N-type semiconductor region, wherein the first and second wirings are approximately parallel to the second gate electrode wiring, a source region of the first N-type semiconductor region is connected with a ground voltage, and a source region of the P-type semiconductor region is connected with a drain voltage.

* * * * *

EX PARTE REEXAMINATION CERTIFICATE (6373rd)

United States Patent
Kawasaki et al.

(10) Number: US 5,598,106 C1
(45) Certificate Issued: Aug. 19, 2008

(54) SEMICONDUCTOR INTEGRATED CIRCUIT FOR PREVENTING DETERIORATION OF THE CHARACTERISTICS OF AN N-CHANNEL TYPE TRANSISTOR

(75) Inventors: Yuji Kawasaki, Kanagawa (JP); Jun Koyama, Kanagawa (JP)

(73) Assignee: Semiconductor Energy Laboratory Co., Ltd., Hase, Atsugi-Shi, Kanagawa-Ken (JP)

Reexamination Request:
No. 90/007,285, Nov. 3, 2004

Reexamination Certificate for:
Patent No.: 5,598,106
Issued: Jan. 28, 1997
Appl. No.: 08/445,412
Filed: May 19, 1995

(30) Foreign Application Priority Data

May 20, 1994 (JP) .............................................. 6-131417

(51) Int. Cl.
*H03K 19/003* (2006.01)
*H03K 17/10* (2006.01)

(52) U.S. Cl. ................................ 326/21; 326/9; 326/81; 326/121

(58) Field of Classification Search ........................ None
See application file for complete search history.

(56) References Cited

U.S. PATENT DOCUMENTS

| 5,097,311 A |   | 3/1992 | Iwase et al. |
|---|---|---|---|
| 5,302,871 A | * | 4/1994 | Matsuzaki et al. .......... 327/288 |
| 5,528,056 A | * | 6/1996 | Shimada et al. ............... 257/72 |

FOREIGN PATENT DOCUMENTS

| CN | 1063588 A |   | 8/1992 |
|---|---|---|---|
| GB | 2 252 213 A |   | 7/1992 |
| JP | 02-025067 |   | 1/1990 |
| JP | 04-179267 |   | 6/1992 |
| JP | 04-195123 A | * | 7/1992 |
| JP | 05-021797 |   | 1/1993 |

* cited by examiner

*Primary Examiner*—Margaret Rubin (57) ABSTRACT

In a semiconductor integrated circuit constructed by thin film transistors (TFTs), an inventor circuit or a NAND circuit is formed by arranging a transmission gate circuit, a P-channel type TFT or an N-channel type TFT between a circuit including at least one P-channel type TFT and a circuit including at least one N-channel type TFT. The N-channel type TFT is earthed. Voltage drop produces by the arranged transmission gate circuit or P-channel or N-channel type TFT, so that the drain voltage of the earthed N-channel type TFT is decreased and an electric field near the drain region of the N-channel type TFT is decreased.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–10 is confirmed.

Claim 11 is cancelled.

Claim 12 is determined to be patentable as amended.

New claims 13–40 are added and determined to be patentable.

12. A semiconductor integrated circuit comprising:
a signal input wiring;
a first gate electrode wiring;
a second gate electrode wiring;
*a third gate electrode wiring*, wherein the first and second gate electrode wirings are formed on the same line, the first and third gate electrode wirings are approximately perpendicular to the second gate electrode wiring, and the second gate electrode wiring and the input wiring are formed on the same line;
a first N-type semiconductor region formed across the first gate electrode wiring;
a second N-type semiconductor region formed across the second gate electrode wiring;
a P-type semiconductor region formed across the third gate electrode wiring;
a first wiring connecting the first N-type semiconductor region with the second N-type semiconductor region; and
a second wiring connecting the P-type semiconductor region with the second N-type semiconductor region, wherein the first and second wirings are approximately parallel to the second gate electrode wiring, a source region of the first N-type semiconductor region is connected with a ground voltage, and a source region of the P-type semiconductor region is connected with a drain voltage.

*13. A semiconductor integrated circuit comprising:*
*a first transistor circuit which includes at least one P-channel type transistor and has a first signal input terminal and a first signal output terminal; and*
*a second transistor circuit which includes at least first and second N-channel type transistors and has a second signal input terminal and a second signal output terminal,*
*wherein the first and second signal input terminals are connected with each other and the first and second signal output terminals are connected with each other,*
*wherein the N-channel type transistor is larger than the P-channel type transistor in number,*
*wherein a gate electrode of the P-channel type transistor and a gate electrode of the first N-channel type transistor are formed on a same line perpendicular to carrier flow direction of the P-channel type transistor and the first N-channel type transistor, and*
*wherein a channel forming region of the P-channel type transistor is formed separately from a channel forming region of the first N-channel type transistor.*

*14. The circuit of claim 13, wherein a semiconductor layer of the P-channel type transistor is formed separately from a semiconductor layer of the first N-channel type transistor.*

*15. The circuit of claim 13, wherein a semiconductor layer of the P-channel type transistor is connected to the first output terminal through a first contact hole, and a semiconductor layer of the first N-channel type transistor is electrically connected to the second output terminal through a second contact hole different from the first contact hole.*

*16. The circuit of claim 13, wherein a carrier flow direction of the P-channel type transistor is parallel with that of the first N-channel type transistor.*

*17. The circuit of claim 13, wherein each of the first and second N-channel type transistors includes a gate electrode, a source region, and a drain region, and wherein an edge of the gate electrode aligns with an edge of the source or drain region in at least one of the first and second N-channel type transistors.*

*18. A semiconductor integrated circuit comprising:*
*a first transistor circuit which includes at least one P-channel type transistor and has a first signal input terminal and a first signal output terminal; and*
*a second transistor circuit which includes at least first and second N-channel type transistors and has a second signal input terminal and a second signal output terminal,*
*wherein the first and second signal input terminals are connected with each other and the first and second signal output terminals are connected with each other,*
*wherein the N-channel type transistor is larger than the P-channel type transistor in number, and*
*wherein a gate electrode wiring of the P-channel type transistor is across a gate electrode wiring of the second N-channel type transistor.*

*19. The circuit of claim 18, wherein a semiconductor layer of the P-channel type transistor is formed separately from a semiconductor layer of the second N-channel type transistor.*

*20. The circuit of claim 18, wherein a semiconductor layer of the P-channel type transistor is connected to the first output terminal through a first contact hole, and a semiconductor layer of the second N-channel type transistor is electrically connected to the second output terminal through a second contact hole different from the first contact hole.*

*21. The circuit of claim 18, wherein a carrier flow direction of the P-channel type transistor is parallel with that of the first N-channel type transistor.*

*22. The circuit of claim 18, wherein the gate electrode of the P-channel type transistor perpendicular crosses the gate electrode of the second N-channel type transistor.*

*23. The circuit of claim 18, wherein each of the first and second N-channel type transistors includes a gate electrode, a source region, and a drain region, and wherein an edge of the gate electrode aligns with an edge of the source or drain region in at least one of the first and second N-channel type transistors.*

*24. A semiconductor integrated circuit comprising:*
*a first transistor circuit which includes at least one P-channel type transistor and has a first signal input terminal and a first signal output terminal; and* a second transistor circuit which includes at least first and second N-channel type transistors and has a second signal input terminal and a second signal output terminal, wherein the first and second signal input terminals are connected with each other and the first and second signal output terminals are connected with each other, wherein the N-channel type transistor is larger than the P-channel type transistor in number, and wherein a carrier flow direction of the first N-channel type transistor is perpendicular to that of the second N-channel type transistor.

25. The circuit of claim 24, wherein each of the first and second N-channel type transistors includes a gate electrode, a source region, and a drain region, and wherein an edge of the gate electrode aligns with an edge of the source or drain region in at least one of the first and second N-channel type transistors.

26. A semiconductor integrated circuit comprising:

a first transistor circuit which includes at least one P-channel type transistor and has a first signal input terminal and a first signal output terminal; and a second transistor circuit which includes at least first and second N-channel type transistors and has a second signal input terminal and a second signal output terminal, wherein the first and second signal input terminals are connected with each other and the first and second signal output terminals are connected with each other, wherein the N-channel type transistor is larger than the P-channel type transistor in number, wherein a carrier flow direction of the first P-channel type transistor is perpendicular to that of the second N-channel type transistor, and wherein a channel forming region of the P-channel type transistor is formed separately from a channel forming region of the second N-channel type transistor.

27. The circuit of claim 26, wherein a semiconductor layer of the P-channel type transistor is formed separately from a semiconductor layer of the second N-channel type transistor.

28. The circuit of claim 26, wherein a semiconductor layer of the P-channel type transistor is connected to the first output terminal through a first contact hole, and a semiconductor layer of the second N-channel type transistor is electrically connected to the second output terminal through a second contact hole different from the first contact hole.

29. The circuit of claim 26, wherein a carrier flow direction of the P-channel type transistor is parallel with that of the first N-channel type transistor.

30. The circuit of claim 26, wherein each of the first and second N-channel type transistors includes a gate electrode, a source region, and a drain region, and wherein an edge of the gate electrode aligns with an edge of the source or drain region in at least one of the first and second N-channel type transistors.

31. A semiconductor integrated circuit comprising:

a first transistor circuit which includes at least one P-channel type transistor and has a first signal input terminal and a first signal output terminal; and a second transistor circuit which includes at least first and second N-channel type transistors and has a second signal input terminal and a second signal output terminal, wherein the first and second signal input terminals are connected with each other and the first and second signal output terminals are connected with each other, wherein the first and second N-channel type transistors are arranged so that a carrier flow direction of the first N-channel type transistor is perpendicular to that of the second N-channel type transistor, wherein the P-channel type transistor and the first N-channel type transistor are arranged so that a carrier flow direction of the P-channel type transistor is parallel with that of the first N-channel type transistor, and wherein the P-channel type transistor is larger than the P-channel type transistor in number.

32. The circuit of claim 31, wherein each of the first and second N-channel type transistors includes a gate electrode, a source region, and a drain region, and wherein an edge of the gate electrode aligns with an edge of the source or drain region in at least one of the first and second N-channel type transistors.

33. A semiconductor integrated circuit comprising:

a first transistor circuit which includes at least one P-channel type transistor and has a first signal input terminal and a first signal output terminal; and a second transistor circuit which includes at least first and second N-channel type transistors and has a second signal input terminal and a second signal output terminal, wherein the first and second signal input terminals are connected with each other and the first and second signal output terminals are connected with each other, wherein a gate electrode of the P-channel type transistor and a gate electrode of the first N-channel type transistor are formed in the same straight line perpendicular to carrier flow direction of the P-channel type transistor and the first N-channel type transistor, wherein the first and second N-channel type transistors are arranged so that a carrier flow direction of the first N-channel type transistor is perpendicular to that of the second N-channel type transistor, and wherein the N-channel type transistor is larger than the P-channel type transistor in number.

34. The circuit of claim 33, wherein each of the first and second N-channel type transistors includes a gate electrode, a source region, and a drain region, and wherein an edge of the gate electrode aligns with an edge of the source or drain region in at least one of the first and second N-channel type transistors.

35. A semiconductor integrated circuit comprising:

a first transistor circuit which includes at least one P-channel type transistor and has a first signal input terminal and a first signal output terminal; and a second transistor circuit which includes at least first and second N-channel type transistors and has a second signal input terminal and a second signal output terminal, wherein the first and second signal input terminals are connected with each other and the first and second signal output terminals are connected with each other, wherein a gate electrode of the P-channel type transistor and a gate electrode of the first N-channel type transistor are formed in the same straight line perpendicular to carrier flow direction of the P-channel type transistor and the first N-channel type transistor, wherein the gate electrode of the P-channel type transistor extends across a gate electrode of the second N-channel type transistor, and wherein the N-channel type transistor is larger than the P-channel type transistor in number.

36. The circuit of claim 35, wherein the gate electrode of the P-channel type transistor extends perpendicularly the gate electrode of the second N-channel type transistor.

37. The circuit of claim 35, wherein each of the first and second N-channel type transistors includes a gate electrode, a source region, and a drain region, and wherein an edge of the gate electrode aligns with an edge of the source or drain region in at least one of the first and second N-channel type transistors.

38. A semiconductor integrated circuit comprising:
   a P-channel type transistor comprising a first gate electrode;
   a first N-channel type transistor comprising a second gate electrode;
   a second N-channel type transistor comprising a third gate electrode,
   an input terminal electrically connected to the first, second, and third gate electrode;
   an output terminal;
   a first terminal for providing a drain voltage;
   a second terminal for providing a ground voltage,
   wherein a source region of the P-channel type transistor is connected to the first terminal for providing a drain voltage,
   wherein a drain region of the P-channel type transistor is connected to the output terminal,
   wherein a source region of the first N-channel type transistor is connected to the second terminal for providing an ground voltage,
   wherein a drain region of the first N-channel type transistor is connected to a source region of the second N-channel type transistor,
   wherein a drain region of the second N-channel type transistor is connected to the output terminal,
   wherein the first gate electrode extends across the third gate electrode, and
   wherein the first gate electrode and the second gate electrode are formed in the same straight line perpendicular to a carrier flow direction of the P-channel type transistor and a carrier flow direction of the first N-channel type trasistor.

39. The circuit of claim 38, wherein the first gate electrode extends perpendicularly the third gate electrode.

40. The circuit of claim 38, wherein each of the first and second N-channel type transistors includes a gate electrode, a source region, and a drain region, and wherein an edge of the gate electrode aligns with an edge of the source or drain region in at least one of the first and second N-channel type transistors.

* * * * *